(12) United States Patent
Wortman et al.

(10) Patent No.: US 8,650,447 B1
(45) Date of Patent: Feb. 11, 2014

(54) APPARATUS AND METHODS FOR CONTROLLED ERROR INJECTION

(75) Inventors: Curt Wortman, Milpitas, CA (US);
Keith Duwel, San Jose, CA (US); Huy Ngo, San Jose, CA (US)

(73) Assignee: Altera Corporation, San Jose, CA (US)

( * ) Notice: Subject to any disclaimer, the term of this patent is extended or adjusted under 35 U.S.C. 154(b) by 314 days.

(21) Appl. No.: 13/183,147

(22) Filed: Jul. 14, 2011

(51) Int. Cl.
*G01R 31/28* (2006.01)
*G01R 27/28* (2006.01)
*G01R 31/00* (2006.01)
*G01R 31/14* (2006.01)
*G11C 7/00* (2006.01)
*G11C 29/00* (2006.01)

(52) U.S. Cl.
USPC ............................ 714/724; 702/117; 365/201

(58) Field of Classification Search
None
See application file for complete search history.

(56) References Cited

U.S. PATENT DOCUMENTS

| | | | |
|---|---|---|---|
| 4,669,081 A * | 5/1987 | Mathewes et al. | 714/703 |
| 4,875,209 A * | 10/1989 | Mathewes et al. | 714/703 |
| 5,428,624 A * | 6/1995 | Blair et al. | 714/727 |
| 6,536,008 B1 * | 3/2003 | Nadeau-Dostie et al. | 714/726 |
| 7,020,803 B2 | 3/2006 | Wolin et al. | |
| 7,406,628 B2 | 7/2008 | Edgar et al. | |
| 7,669,095 B2 | 2/2010 | Clark et al. | |
| 2005/0177778 A1 * | 8/2005 | Holian et al. | 714/42 |
| 2005/0188281 A1 * | 8/2005 | Nguyen et al. | 714/42 |
| 2005/0246600 A1 * | 11/2005 | Pistoulet | 714/724 |
| 2006/0184707 A1 | 8/2006 | Lesartre | |
| 2008/0163005 A1 | 7/2008 | Sonksen et al. | |
| 2012/0239993 A1 * | 9/2012 | Chung | 714/727 |

* cited by examiner

*Primary Examiner* — Guerrier Merant
(74) *Attorney, Agent, or Firm* — Okamoto & Benedicto LLP

(57) ABSTRACT

In accordance with an embodiment of the invention, precision control of error injection may be accomplished by way of synchronous error signals accompanying data transfers along various pipeline stages of a data path. The synchronous error signals may be used to trigger error events in a given protocol logic block (i.e. in a given sub-component of the data path). The protocol logic block is configurable to determine whether any action is to be taken upon the assertion of the error signal. Multiple error events may be triggered as the data signal (and its accompanying synchronous error signal) passes through pipelined functions of the data path so as to create complex error conditions. In addition, deterministic handling of created errors may be accomplished using a loopback path with bypassable blocks on both forward and reverse transformations. Other embodiments, aspects and features are also disclosed.

20 Claims, 9 Drawing Sheets

APPARATUS AND METHODS FOR CONTROLLED ERROR INJECTION

BACKGROUND

1. Technical Field

The present disclosure relates to apparatus and methods for controlled error injection in transceivers and other electronic circuitry.

2. Description of the Background Art

There is increasing interest in the use of high-speed serial data communication for exchange of data between electronic devices. There are many possible protocols for such high-speed serial interfaces. Some of these protocols may be industry-standard protocols. Other protocols may be custom-designed for particular systems.

Examples of industry-standard protocols include PCI Express® (Peripheral Component Interconnect Express), XAUI (X Attachment Unit Interface), sRIO (serial Rapid IO), and many others. PCI Express® is a point-to-point serial interface introduced by Intel Corporation of Santa Clara, Calif., and may be used, for example, as an expansion card interface for computer systems. XAUI is a multi-lane serial interface that has an aggregated bandwidth of 10 gigabits per second serial interface which may be used, for example, as a chip-to-module or chip-to-chip interface. sRIO is a high-performance packet-switched interface which is typically used for a cluster of multiple devices.

A protocol specifies various features of the communication system. A protocol may specify, for example: the data format; how many channels are used together to provide an overall communication link; at what speed a channel is operated; how errors are to be treated; and so forth. Error handling may be defined by a protocol using state diagrams which may be implemented as state machines in digital logic.

As data communication protocols grow in complexity and the requirement for robustness increases, validation of system level error handling becomes more difficult and problematic.

SUMMARY

In accordance with embodiments of the invention, precision control of error injection is accomplished by way of synchronous error signals accompanying data transfers along various pipeline stages of a data path. The synchronous error signals may be used to trigger error events in a given protocol logic block (i.e. in a given sub-component of the data path). Logic circuitry in the protocol logic block is arranged and configured to determine whether any action is to be taken upon the assertion of the error signal.

In one embodiment, an integrated circuit includes a series of logic blocks and a data path arranged to transfer a data signal through the series of logic blocks. An error signal path is arranged through the series of logic blocks to transfer a synchronous error signal along with the data signal. Error injection circuitry may be configured to inject an error event into the data signal as the data signal passes through a particular logic block. The error injection may be triggered by the synchronous error signal.

In another embodiment, a transceiver includes a data transmission path arranged to transfer an outgoing data signal through a first series of protocol logic blocks and a data reception path arranged to transfer an incoming data signal through a second series of protocol logic blocks. A first error signal path is arranged to transfer a first synchronous error signal through the first series of protocol logic blocks, and a second error signal path arranged to transfer a second synchronous error signal through the second series of protocol logic blocks. In addition, error injection circuitry is configured to inject a first error event, triggered by the first synchronous error signal, into the outgoing data signal. The error injection circuitry is also configured to inject a second error event, triggered by the second synchronous error signal, into the incoming data signal.

Another embodiment relates to a method for controlled error injection in an integrated circuit. A first data signal and a first error signal are transferred in parallel and in synchronization through a first series of logic blocks of the first data path. A first error event is injected into the first data signal at a specific location in the first data path, the specific location being specified by setting a configuration flag of a plurality of configuration flags. The first error signal acts as a trigger for the injection of the first error event at the specific location in the first data path.

Other embodiments, aspects and features are also disclosed.

DETAILED DESCRIPTION

Validation of system level error handling is growing more problematic as data communication protocols become more complex. Complex error scenarios may be required to properly validate the system level error handling for such protocols.

In order to create complex error scenarios, it is highly desirable to have precise control over the location and timing of the error injection(s). Such precisely-controlled error injection is difficult to achieve in protocol logic that is implemented in hard-wired circuitry in a physical coding sublayer (PCS) circuit module. The difficulty may arise, in part, for example, because it may be highly desirable to limit the number of signal lines that connect core logic circuitry of an integrated circuit to the PCS module. Increasing the number of lines in the core/PCS interface is typically quite costly in that each additional line requires multiple register stages to maintain alignment across clock domains.

The present patent application discloses an innovative solution to the above-described challenges and difficulties. In accordance with embodiments of the invention, precision control of error injection is accomplished by way of synchronous error signals accompanying data transfers along various pipeline stages of a data path. The synchronous error signals may be used to trigger error events in a given protocol logic block (i.e. in a given sub-component of the data path). Logic circuitry in the protocol logic block is arranged and configured to determine whether any action is to be taken upon the assertion of the error signal. For example, upon assertion of the error signal, logic circuitry in the protocol logic block may invert the expected data, purposefully corrupting the data integrity of the data transfer.

By using the precisely-controlled error injection, multiple error events may be triggered as the data signal (and its accompanying synchronous error signal) passes through pipelined functions of the data path so as to create complex error conditions. In addition, deterministic handling of created errors may be accomplished using a loopback path with bypassable blocks on both forward and reverse transformations. The configurable control for the error injection may be implemented using a central processing unit (CPU) driven interface for interactive control or by using a configuration RAM (CRAM) image.

Figure 1:
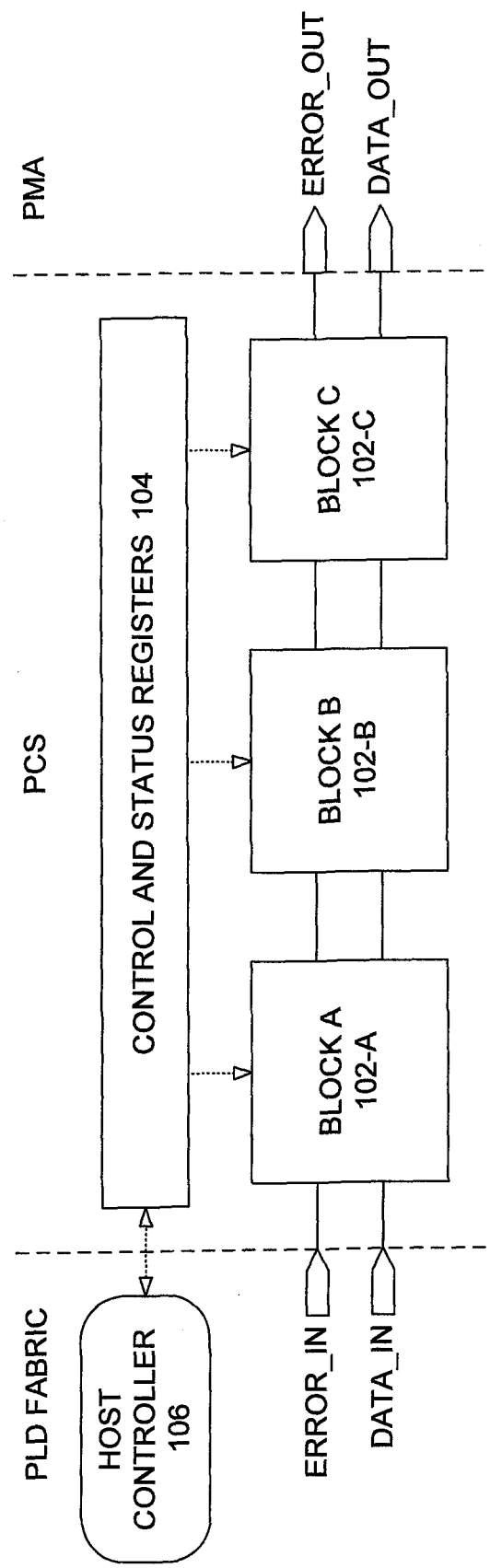
FIG. 1 shows a plurality of circuit blocks in an exemplary data path and an accompanying error signal in accordance with an embodiment of the invention.

FIG. 1 shows a plurality of circuit blocks in an exemplary data path and an accompanying error signal in accordance with an embodiment of the invention. The exemplary data path is implemented within physical coding sublayer (PCS) circuitry and provides a data transfer path from programmable logic in a programmable logic device (PLD) core (also referred to as a PLD fabric) to physical medium attachment (PMA) circuitry. The teachings disclosed herein may also be applied to other data transfer paths. For example, the teachings disclosed herein may be applicable to the reverse data transfer path from the PMA circuitry to the PLD core, as discussed further below in relation to FIGS. 3 and 4.

The PCS circuitry generally provides digital logic functions which implement data communication protocols (or portions thereof), while the PMA circuitry generally provides mixed (analog/digital) signal functionality for the data communications. For example, for certain protocols, the PCS circuitry may be configured to perform, among other functions, 64-bit to 66-bit encoding for data to be sent to the PMA circuitry and 66-bit to 64-bit alignment and decoding for data received from the PMA circuitry. The PMA circuitry may be configured to perform, among other operations, serialization of data to be transmitted (conversion from parallel to serial) and de-serialization of received data (conversion from serial to parallel).

The example data transfer path in the PCS circuitry shown in FIG. 1 may include a plurality of protocol logic blocks in pipeline stages to transfer data received from the PLD fabric to the PMA circuitry. In particular, three protocol logic blocks (Block A 102-A, Block B 102-B, and Block C 102-C) are depicted in FIG. 1. While a pipeline with three stages is shown in this exemplary data transfer path, other data transfer paths may have more than three or less than three stages. The protocol logic blocks may include various functionalities. For example, for data transmission, the protocol logic blocks may include circuitry arranged to provide frame generation, checksum generation, 64-bit-to-66-bit encoding, scrambling, disparity generation, and other functionalities.

The data transfer path may be multiple bits wide (for example, 64 bits wide) and may comprise, for example, a data transmission path, such as that shown in FIG. 1. In the case of a data transmission path, the input data signal (DATA_IN) is at the start of the data transfer path, and the output data signal (DATA_OUT) is at the end of the data transfer path.

In accordance with an embodiment of the invention, the data transfer path in the PCS circuitry may be configured such that a synchronous error signal (ERROR_IN/ERROR_OUT) accompanies the multiple-bit data signal (DATA_IN/DATA_OUT). As described herein, the synchronous error signal may be a single error signal (i.e. on a single line) to reduce the number of lines to/from the PLD fabric. A synchronous error signal in accordance with embodiments of the present invention may be used for the precise alignment of an error event to a particular data transfer. A precise alignment capability in accordance with embodiments of the present invention enables the efficient creation of complex error events, where multiple errors may be injected into a single data word, even if only a single error signal (i.e. a one-bit wide error signal) is used.

Control and status registers 104 are coupled to the protocol logic blocks (in this example, 102-A, 102-B, and 102-C). These registers may be configured, for example, by a host controller 106 loading a control-and-status-register (CSR) bitmap from flash memory. In accordance with an embodiment of the invention, the registers 104 may include multiple configuration RAM (CRAM) bits which may be utilized to represent multiple potential error injection events. The multiple error injection events may be used either separately (exclusively) or in combination to create complex stacked errors.

Figure 2:
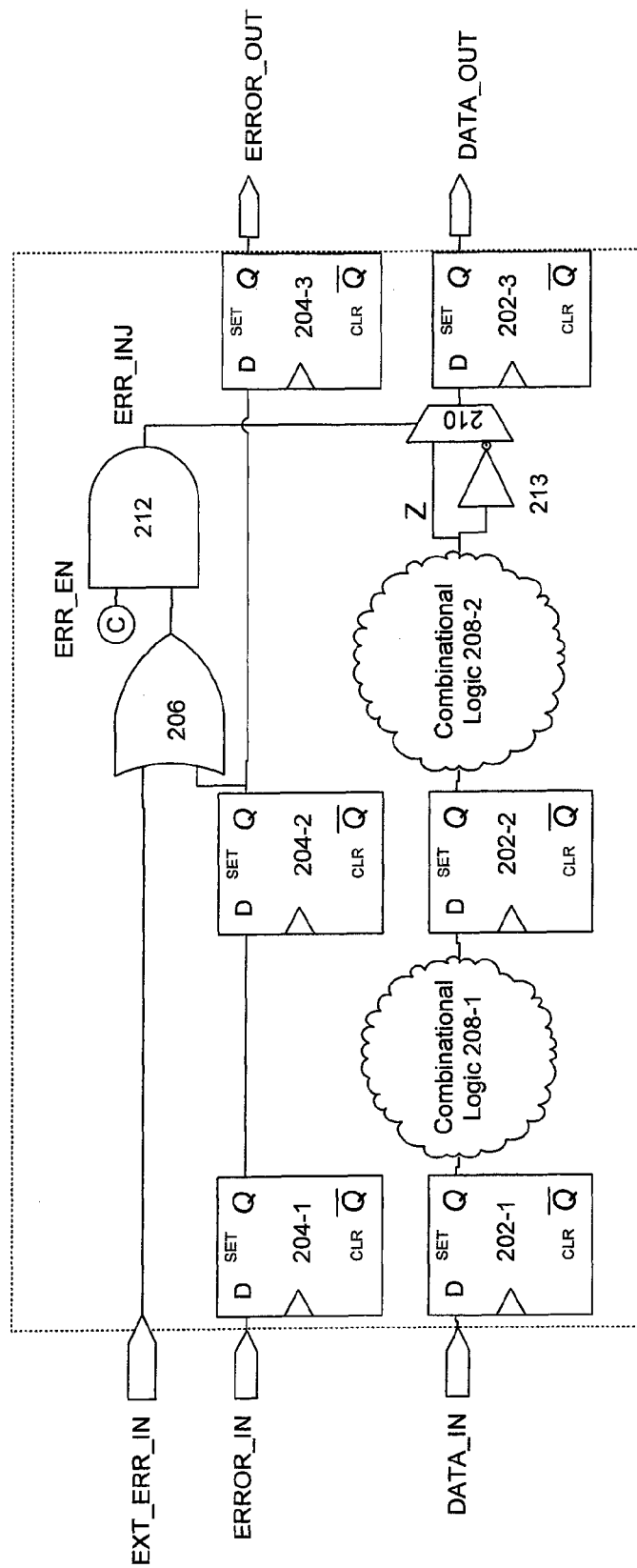
FIG. 2 shows exemplary circuitry for a one-bit wide portion of a data transfer path and a one-bit wide portion of an error signal path in a protocol logic block in accordance with an embodiment of the invention.

FIG. 2 shows exemplary circuitry 200 in a protocol logic block of a pipeline stage in accordance with an embodiment of the invention. Each of the protocol logic blocks (102-A, 102-B, or 102-C) of FIG. 1 may be arranged with similar such circuitry based on the circuitry 200 shown in FIG. 2. As depicted in FIG. 2, a data signal (DATA_IN) may be received into a first data flip-flop circuit 202-1 of the data transfer path and an accompanying error signal (ERROR_IN) may be received into a first error flip-flop circuit 204-1 of the error signal path. While a single line of the data signal is shown for ease of illustration, it is to be understood that there are preferably multiple data signal lines (for example, 64 data lines). In addition, an external error signal (EXT_ERR_IN) may be received into a first input of a logical OR gate 206.

In the illustrated embodiment, a first grouping of combinational logic 208-1 may be arranged to operate upon the data signal received from the data output (Q and/or Qbar) of the first data flip-flop circuit 202-1 and output the resultant data signal to the data input (D) a second data flip-flop circuit 202-2. Meanwhile, the accompanying error signal may be transferred from the first error flip-flop circuit 204-1 to the second error flip-flop circuit 204-2. As further depicted, a second grouping of combinational logic 208-2 may be arranged to operate upon the data signal received from the data output (Q and/or Qbar) of the second data flip-flop circuit 202-2 and output the resultant data signal, and its logical inverse (as provided by the inverter 213), to the inputs of a multiplexer 210.

The multiplexer 210 may be arranged to controllably output either the data signal Z from the second grouping of combinatorial logic 208-2, or its logical inverse which is provided by the inverter 213, to the third data flip-flop circuit 202-3. In this case, the third data flip-flop circuit 202-3 outputs the data signal (DATA_OUT) to the next pipeline stage (or to the PMA if this is the last pipeline stage). Meanwhile, the error signal may be output from the second error flip-flop circuit 204-2 to the third error flip-flop circuit 204-3 (and also to the second input of the logical OR gate 206). In this case, the third error flip-flop circuit 204-3 outputs the error signal (ERROR_OUT) to the next pipeline stage (or to the PMA if this is the last pipeline stage).

In accordance with an embodiment of the invention, multiple configuration RAM (CRAM) bits may be provided in the control and status registers 104 to provide error injection enable flags or bits. One such CRAM bit (C) is depicted in FIG. 2 in relation to the illustrated data line. For example, if C is set, then ERR_EN (error enable) may be set, so as to enable error injection into the illustrated data line.

In particular, in the simplified schematic of FIG. 2, the EN_ERR signal and the output of the OR gate 206 may be provided to logic circuitry depicted as the AND gate 212. In this simplified circuit, if the EN_ERR signal is set, and at least one of the EXT_ERR_IN and ERROR_IN signals is set, then the ERR_INJ signal that is output by the AND gate 212 will be set. Otherwise, if the EN_ERR signal is reset, or both the EXT_ERR_IN and ERROR_IN signals are reset, then the ERR_INJ signal will be reset. The multiplexer 210 may be configured to output the data signal Z when ERR_INJ is reset and to output the inverse of the data signal Z (i.e. Zbar) when ERR_INJ is set. Error is not injected in the former case, and error is injected in the latter case.

In accordance with an embodiment of the invention, using the multiple CRAM bits, a single error signal line may be used for multiple error injection scenarios. The multiple error injection scenarios may be used exclusively, or in combination to create complex stacked errors. Such complex stacked errors (which may inject multiple errors into a single data word) are enabled by the presently-disclosed circuit architecture.

In one embodiment, external error injection may act as a trigger for a one-shot injection event, where a captured event may be delayed until an associated action is taken. In one implementation, either the synchronous assertion of the external error signal (such as EXT_ERR_IN) or the synchronous in-line error signal (such as ERROR_IN) may be the trigger. In one example, the external error is captured, and the error is asserted (injected) with the alignment of the next start of the frame word found in the data stream.

Figure 3:
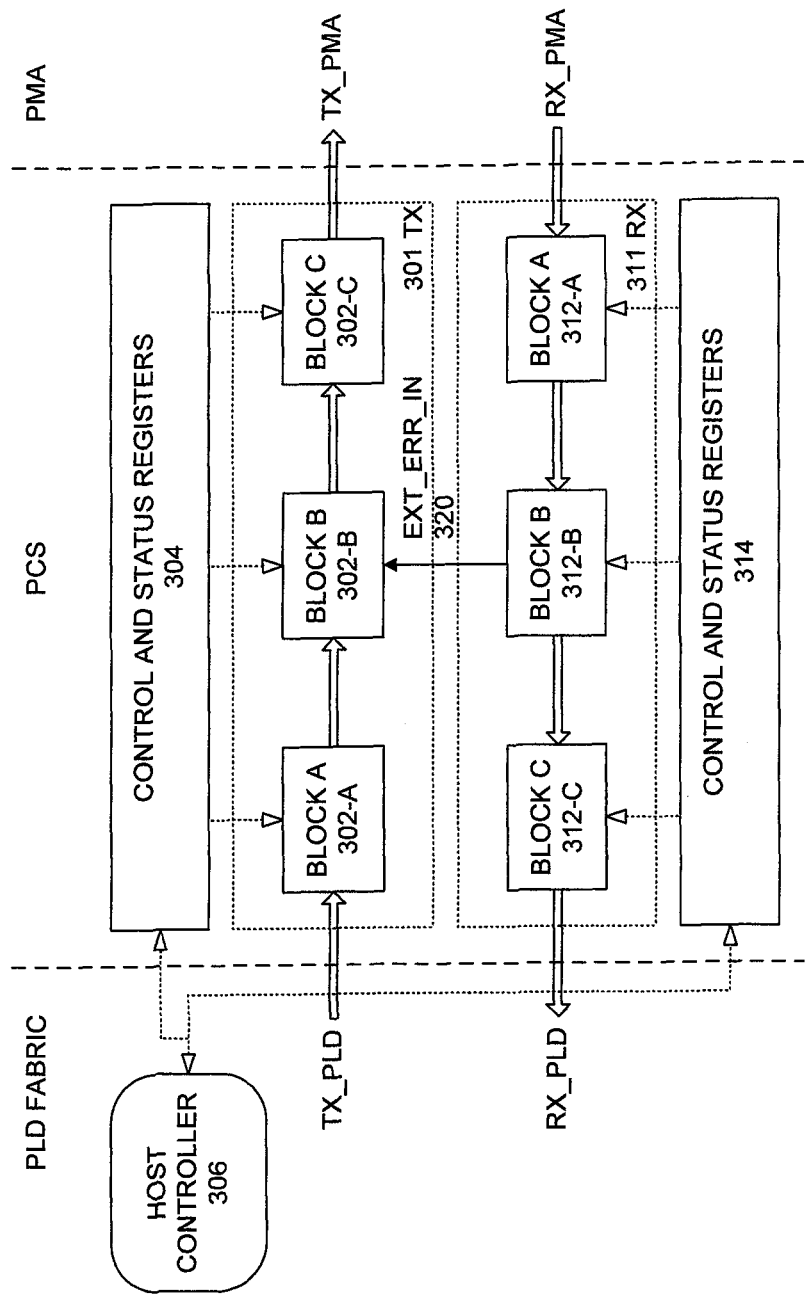
FIG. 3 shows exemplary transmit and receive data paths in accordance with an embodiment of the invention.

FIG. 3 shows exemplary transmit and receive data paths in accordance with an embodiment of the invention. The example data paths are implemented within physical coding sublayer (PCS) circuitry and provides a data transmission path 301 from programmable logic in the PLD (programmable logic device) fabric to physical medium attachment (PMA) circuitry and a data reception path 311 from the PMA circuitry to the PCS circuitry. The teachings of the disclosed herein may also be applied to other data transfer paths.

While the TX_PMA signals are outgoing data and error signals output from the data transmission path 301 to the PMA circuitry, the RX_PMA signals are incoming data and error signals input from the PMA circuitry to the data reception path 311. While the TX_PLD signals are outgoing data and error signals output from the PLD fabric to the data transmission path 301, the RX_PLD signals are incoming data and error signals input from the data reception path 311 to the PLD fabric.

A first set of control and status registers 304 are coupled to the protocol logic blocks (in this example, 302-A, 302-B, and 302-C) in the data transmission path 301. Similarly, a second set of control and status registers 314 are coupled to the protocol logic blocks (in this example, 312-A, 312-B, and 312-C) in the data reception path 311. These control and status registers may be configured, for example, by a host controller 306 loading a control-and-status-register (CSR) bitmap from flash memory.

While three protocol logic blocks (Block A 302-A, Block B 302-B, and Block C 302-C) are shown in this example data transmission path 301 other data transmission paths may have more than three or less than three protocol logic blocks.

Similarly, while three protocol logic blocks (Block A 312-A, Block B 312-B, and Block C 312-C) are shown in this example data reception path 311, other data reception paths may have more than three or less than three protocol logic blocks.

The example data transmission path 301 shown in FIG. 3 includes a plurality of protocol logic blocks (in this case, Block A 302-A, Block B 302-B, and Block C 302-C) and transfers outgoing data received from the PLD fabric to the PMA circuitry. These protocol logic blocks in the data transmission path 301 may include circuitry arranged to perform various functionalities, such as, for example, frame generation, checksum generation, 64-bit-to-66-bit encoding, scrambling, disparity generation, and other functionalities. Shown in FIG. 3 are the input data and error signals (TX_PLD) at the start of the data transmission path 301 and the output data and error signals (TX_PMA) at the end of the data transmission path 301. In other words, the input data and error signals (TX_PLD) in FIG. 3 correspond to the DATA_IN and ERROR_IN signals in FIG. 1, and the output data and error signals (TX_PMA) in FIG. 3 correspond to the DATA_OUT and ERROR_OUT signals in FIG. 1.

The example data reception path 311 shown in FIG. 3 includes a plurality of protocol logic blocks (in this case, Block A 312-A, Block B 312-B, and Block C 312-C) and transfers incoming data received from the PMA circuitry to the PLD fabric. The protocol logic blocks in the data reception path 311 may include circuitry arranged to perform various functionalities, such as, for example, block synchronization, disparity checking, descrambling, 66-bit-to-64-bit decoding, checksum verification, and other functionalities. Shown in FIG. 3 are the input data and error signals (RX_PMA) at the start of the data reception path 311 and the output data and error signals (RX_PLD) at the end of the data reception path 311.

As described above in relation to FIGS. 1 and 2, the data buses for the data transmission and reception paths (301 and 311, respectively) may be multiple-bits wide (for example, 64-bits wide). Meanwhile, the error injection signals may be a single bit (single line) for each of the data transmission and reception paths. The use of a single line for each error injection signal reduces or minimizes a number of input/output lines on the PCS/PLD interface. In accordance with one embodiment, a single error signal may be used to create multiple error types and events; even one cycle on the error signal may cause "stacked" errors as that signal will ripple from one block to another. The error signal is aligned to a particular piece of data, and different stages in the blocks may cause different types of error types to be injected.

In accordance with an embodiment of the invention, an error event may be detected by error-detection logic in a protocol logic block within the data reception path 311. The error-detection logic may be circuitry which is specific to the communication protocol being implemented. For example, an error event may be detected within protocol logic in Block B 312-B in the data reception path 311. As part of its response to the error event, the protocol logic block in the data reception path 311 (in this example, Block B 312-B) may be arranged to send an external error signal (EXT_ERR_IN 320) to a protocol logic block within the data transmission path 301 (in this example, Block B 302-B). The external error signal may cause an error to be injected into the data signal in the transmission path 301 (for example, as described above in relation to FIG. 2). Advantageously, this reduces the latency and round trip time for the error. In other words, the transceiver which sent the data including the error will receive an indication of the error. Note that, while the illustrated embodiment in FIG. 3 shows an external error signal path (see EXT_ERR_IN) from Block B 312-B to Block B 302-B, other embodiments of the invention may provide different or other external error signal paths within the PCS circuitry of the transceiver.

Figure 4:
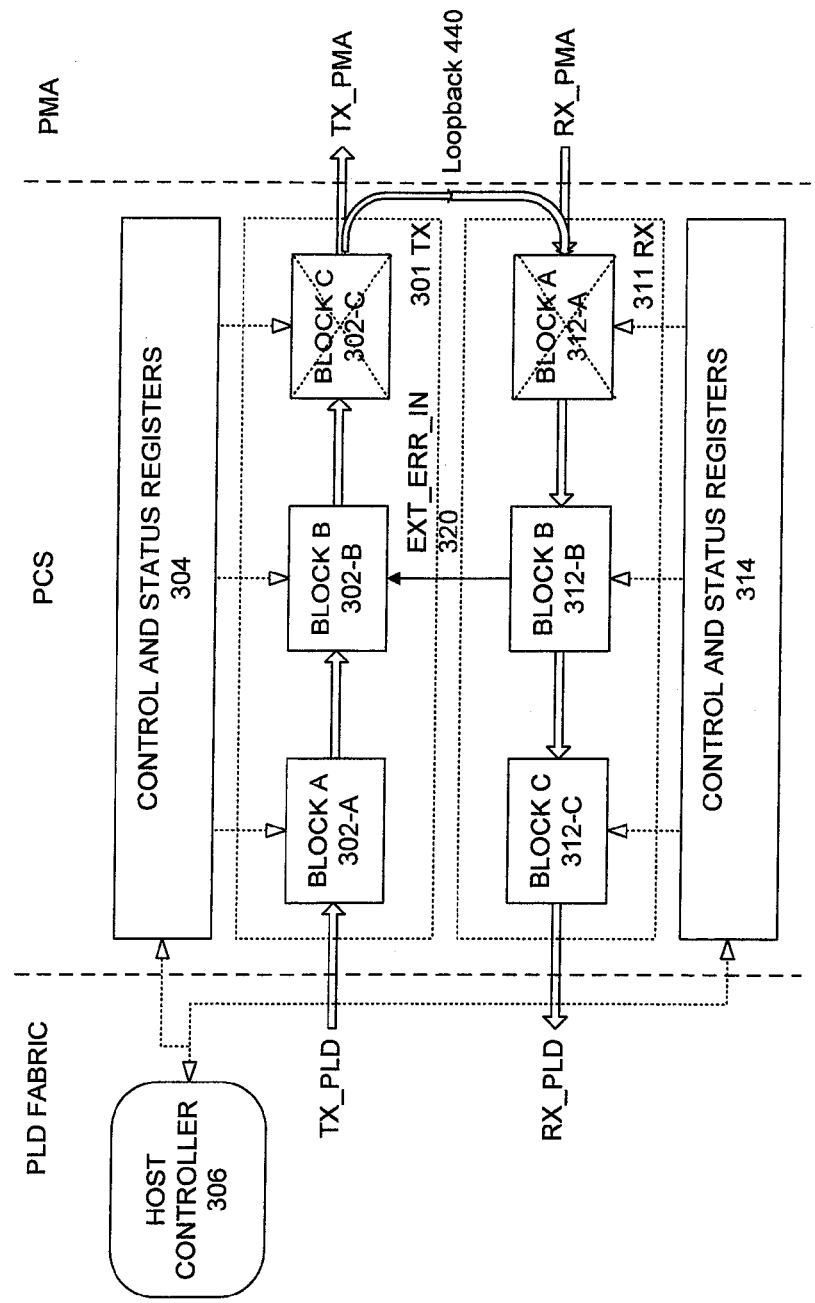
FIG. 4 depicts an exemplary loopback of data with bypassable blocks in accordance with an embodiment of the invention.

FIG. 4 depicts an exemplary loopback of data with bypassable blocks in accordance with an embodiment of the invention. Within a single device, the bypassable blocks enable the error signal to be looped back from the TX path to a corresponding point in the RX path. This feature may be utilized to advantageously allow cycle accurate timing of error events by bypassing blocks that would otherwise add indeterminism to the timing. For example, a cycle-accurate error event (such as particular data marked with an error) may be injected in one block and handled in subsequent blocks.

The exemplary PCS circuitry shown in FIG. 4 includes a data transmission path 301 and a data reception path 311 and the other circuitry described above in relation to FIG. 3. In addition, in FIG. 4, loopback signals 440 are schematically shown. The loopback signals 440 may be implemented internally in the PCS circuitry using a data path which is as wide as that of the protocol logic block with the largest data path width. The loopback signals 440 may transfer data directly from a protocol logic block (for example, Block C 302-C) in the data transmission path 301 to a corresponding protocol logic block (for example, Block A 312-A) in the data reception path 311. Because the loopback signals 440 transfer data internally within the PCS circuitry, they may be used to advantageously avoid indeterminism in the timing due to any effect from external circuitry and devices, such as FIFOs, gearboxes, analog circuits, and so forth.

Moreover, if corresponding protocol logic blocks in the PCS circuitry of the transceiver (for example, blocks 302-C and 312-A) are configured to be bypassed using the loopback signals 440, then indeterminism in the timing that would be added by those blocks may also be bypassed. Such bypassing of corresponding protocol logic blocks in the TX and RX paths works because the RX path may be considered as implementing a transformation which is the reverse of the transformation performed by the TX path. In other words, while the TX path performs a forward transformation of the data, the RX path performs the reverse transformation.

In the embodiment depicted in FIG. 4, both the last protocol logic block (Block C 302-C) in the data transmission path 301 and the first protocol logic block (Block A 312-A) in the data reception path 311 may implement paired TX (encoder or forward transformation) and RX (decoder or reverse transformation) functions. As such, these paired blocks (Block C 302-C and Block A 312-A) may be configured to be bypassed (as indicated by the dotted X). In this case, the data and control signals are effectively transferred, using the internal loopback signals 440, from the second protocol logic block (Block B 302-B) in the data transmission path 301 directly to the second protocol logic block (Block B 312-B) in the data reception path 311. This bypasses the last protocol logic block (Block C 302-C) in the data transmission path 301, the first protocol logic block (Block A 312-A) in the data reception path 311, and circuitry and devices outside the PCS circuitry, such as the PMA circuitry and other circuitry and devices which may be connected to the PMA circuitry.

While the illustrated embodiment in FIG. 4 depicts the bypassing of the last protocol logic block (Block C 302-C) in the data transmission path 301 and the first protocol logic block (Block A 312-A) in the data reception path 311, other embodiments may bypass additional paired protocol logic blocks. For example, Block B 302-B in the data transmission path 301 and Block B 312-B in the data reception path 311 may also implement paired TX and RX functions and may be configured to be bypassed. In that case, the data and control signals would be effectively transferred, using the internal loopback signals 440, from the first protocol logic block (Block A 302-A) in the data transmission path 301 directly to the last protocol logic block (Block C 312-C) in the data reception path 311.

Figure 5:
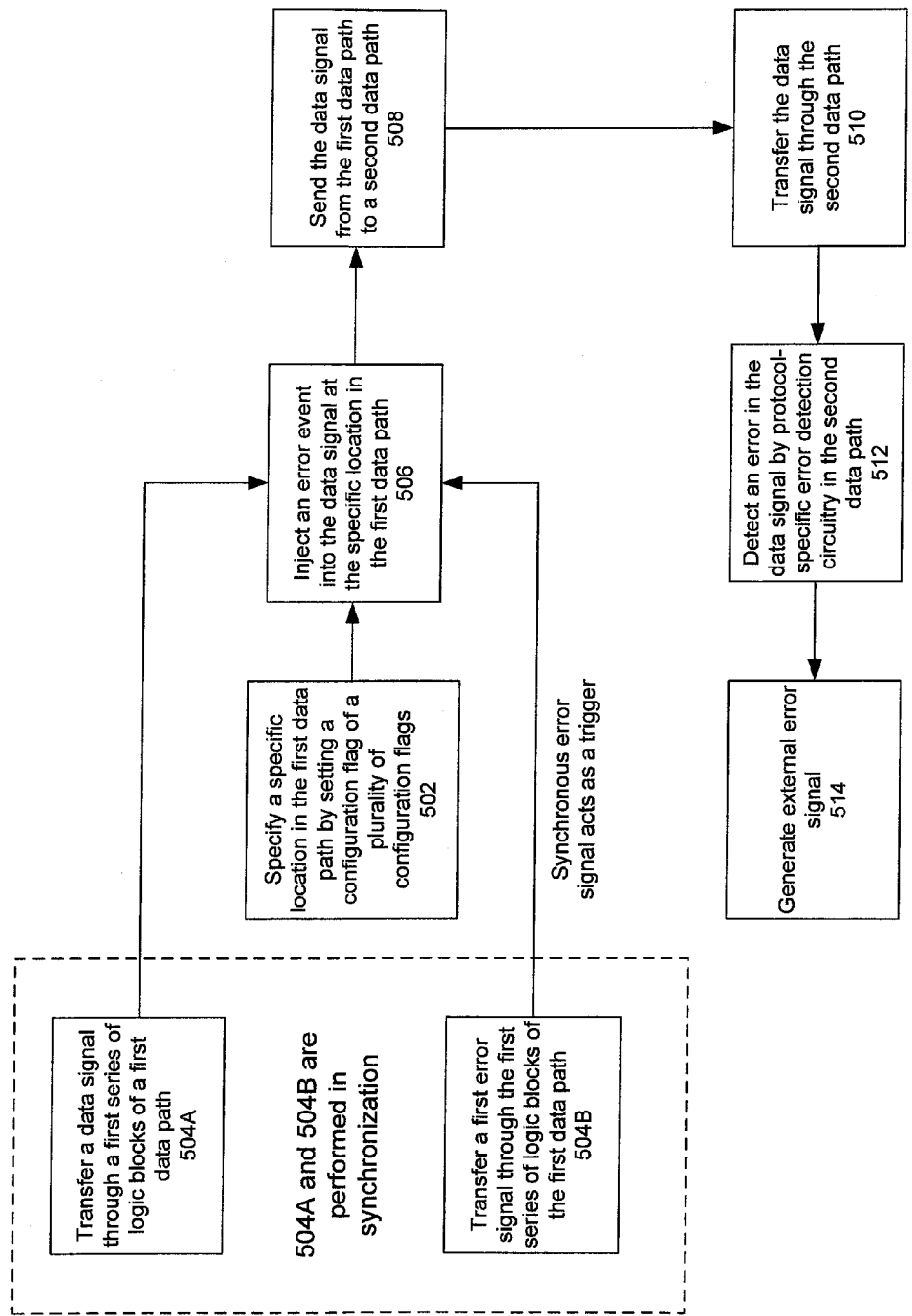
FIG. 5 is a flow chart of an exemplary method for controlled error injection in an integrated circuit in accordance with an embodiment of the invention.

FIG. 5 is a flow chart of an exemplary method 500 for controlled error injection in an integrated circuit in accordance with an embodiment of the invention. Per step 502, a specific location in a first data path may be specified by setting a configuration flag of a plurality of configuration flags. The specific location may be the location at which an error is to be injected.

Per step 504A, a data signal may be transferred through a first series of logic blocks of a first data path. Per step 504B, an error signal may be transferred through the first series of logic blocks of the first data path. As indicated, steps 504A and 504B may be performed in synchronization with each other such that the data and error signals are synchronized as they travel through the first data path.

Per step 506, an error event is injected at the specific location in the first data path. As indicated, the synchronous error signal may act as a trigger for the injection of the error event at the specific location.

Steps 502, 504A/B and 506 may be used to provide for precise control of error injection into the data path. Such precise error injection may be provided for more than one data path in an integrated circuit.

The data signal may be sent from the first data path to a second data path per step 508. In one embodiment, as shown in FIG. 4, the second data path may be on the same integrated circuit as the first data path, and the data signal may be sent from the first data path to the second data path via a loop path. In other embodiments, as shown in FIGS. 6A and 6B, the second data path may be on a separate integrated circuit.

Per step 510, the data signal may then be transferred through a second series of logic blocks of the second data path. Per step 512, protocol-specific error detection circuitry in the second data path may be used to detect an error in the data signal. Per step 514, if an error is detected, then an external error signal may be generated by the error detection circuitry. In one embodiment, the external error signal may be sent to protocol logic in the first data path.

Figure 6A:
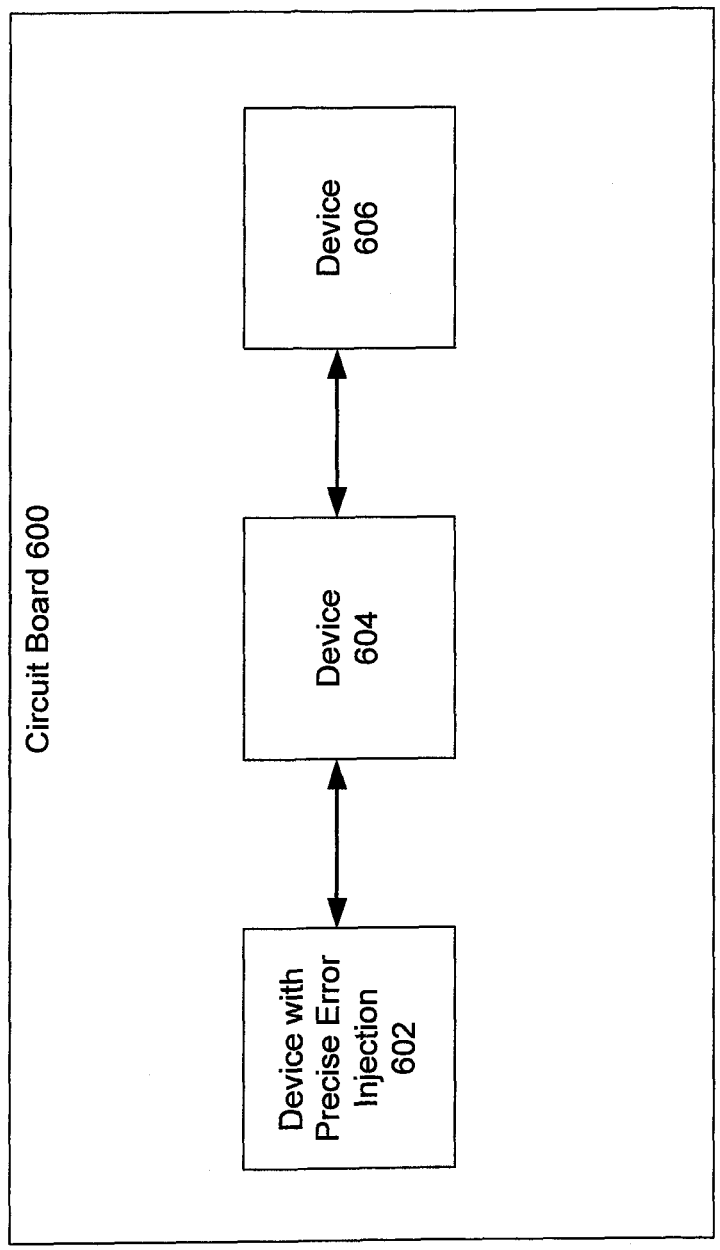
FIGS. 6A and 6B are exemplary block diagrams of multiple devices connected together in accordance with embodiments of the invention.

FIG. 6A is an exemplary block diagram showing multiple integrated circuit devices (602, 604, 606) interconnected together on a circuit board 600 in accordance with an embodiment of the invention. In this example, a first device 602 includes circuitry for precise error injection as disclosed herein, while a second device 604 and a third device 606 may not include such precise error injection circuitry. In this example, even though only the first device 602 includes precise error injection circuitry, the precise error injection circuitry in the first device 602 may be used to test error handling/propagation capabilities in the other devices (604 and 606). This is because the first device 602 may precisely inject an error into the data stream being sent to the second and third devices (604 and 606).

Figure 6B:
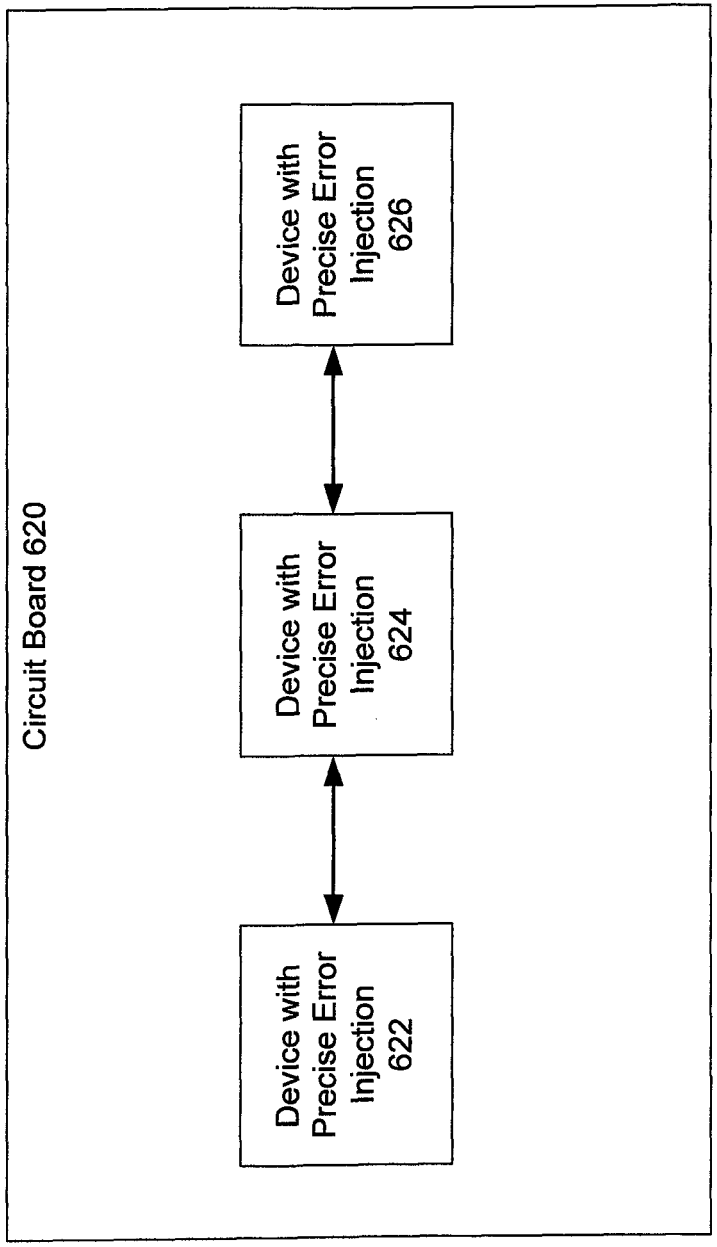

FIG. 6B is another exemplary block diagram showing multiple integrated circuit devices (622, 624, 626) interconnected together on a circuit board 620 in accordance with another embodiment of the invention. In this example, the first, second and third devices (622, 624, 626) each includes circuitry for precise error injection as disclosed herein. In this example, the precise error injection capabilities of the multiple devices may be advantageously used to cascade error events to create complex error events that would be difficult to simulate. System level firmware or software may be coupled with hardware error detection to determine event handling. This feature is beneficial for hardware testing or in field debugging of failures.

Figure 7:
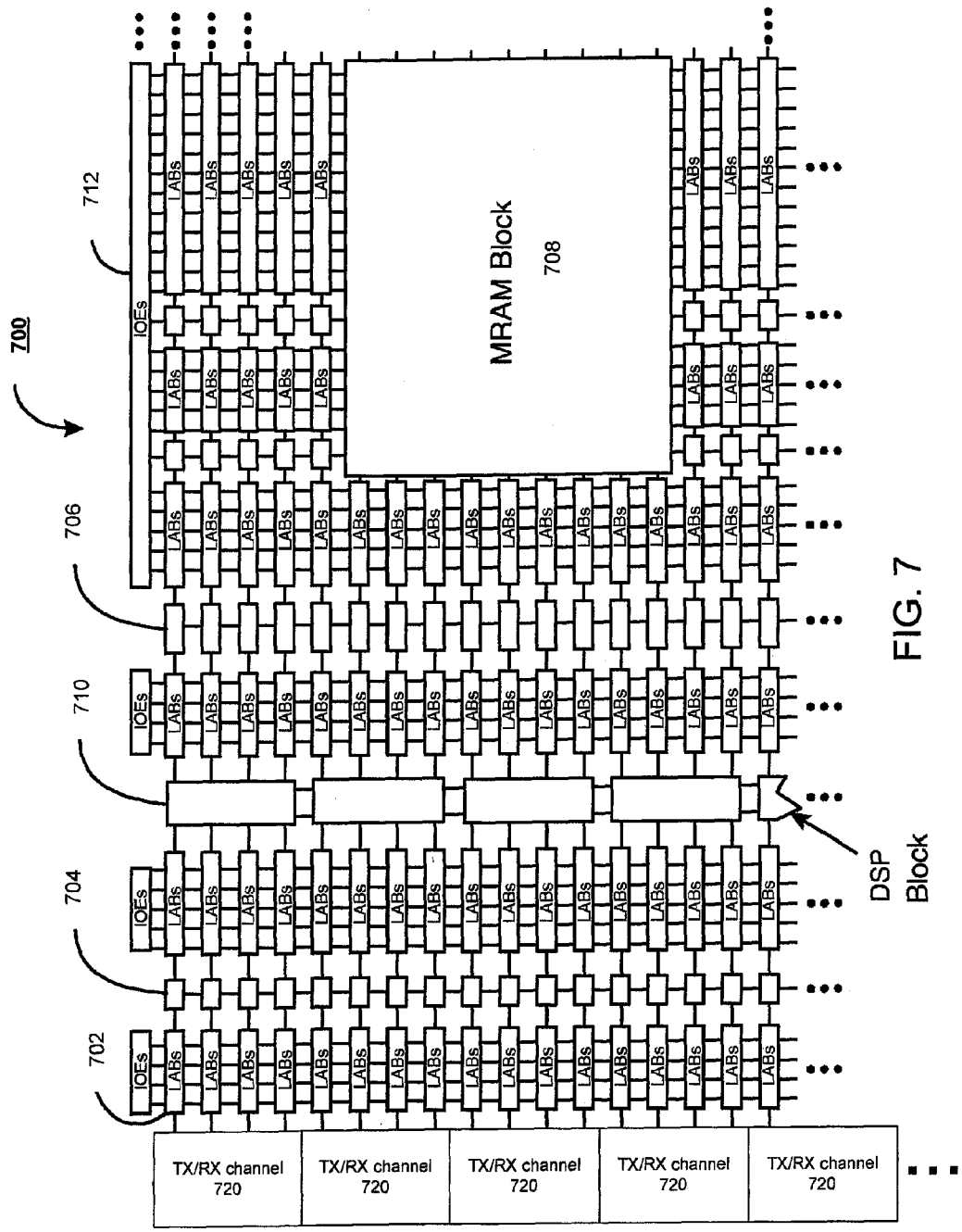
FIG. 7 is an exemplary simplified partial block diagram of a field programmable gate array (FPGA) that may be configured to implement an embodiment of the present invention.

FIG. 7 is an exemplary simplified partial block diagram of a field programmable gate array (FPGA) 700 that can include aspects of the present invention. It should be understood that embodiments of the present invention can be used in numerous types of integrated circuits such as: programmable logic devices (PLDs), including field programmable gate arrays (FPGAs), complex programmable logic devices (CPLDs), and programmable logic arrays (PLAs); digital signal processors (DSPs) and application specific integrated circuits (ASICs).

FPGA 700 includes within its "core" or "fabric" a two-dimensional array of programmable logic array blocks (or LABs) 702 that are interconnected by a network of column and row interconnect conductors of varying length and speed. LABs 702 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 700 may also include a distributed memory structure including random access memory (RAM) blocks of varying sizes provided throughout the array. The RAM blocks include, for example, blocks 704, blocks 706, and block 708. These memory blocks can also include shift registers and FIFO buffers.

FPGA 700 may further include digital signal processing (DSP) blocks 710 that can implement, for example, multipliers with add or subtract features. Input/output elements (IOEs) 712 located, in this example, around the periphery of the chip support numerous single-ended and differential input/output standards. Each IOE 712 is coupled to an external terminal (i.e., a pin) of FPGA 700. A transceiver (TX/RX) channel array may be arranged as shown, for example, with each TX/RX channel circuit 720 being coupled to several LABs. A TX/RX channel circuit 720 may include PCS and PMA circuitry, and the PCS circuitry may include the error injection circuitry as described herein.

It is to be understood that FPGA 700 is described herein for illustrative purposes only and that the present invention can be implemented in many different types of PLDs and other integrated circuits.

Figure 8:
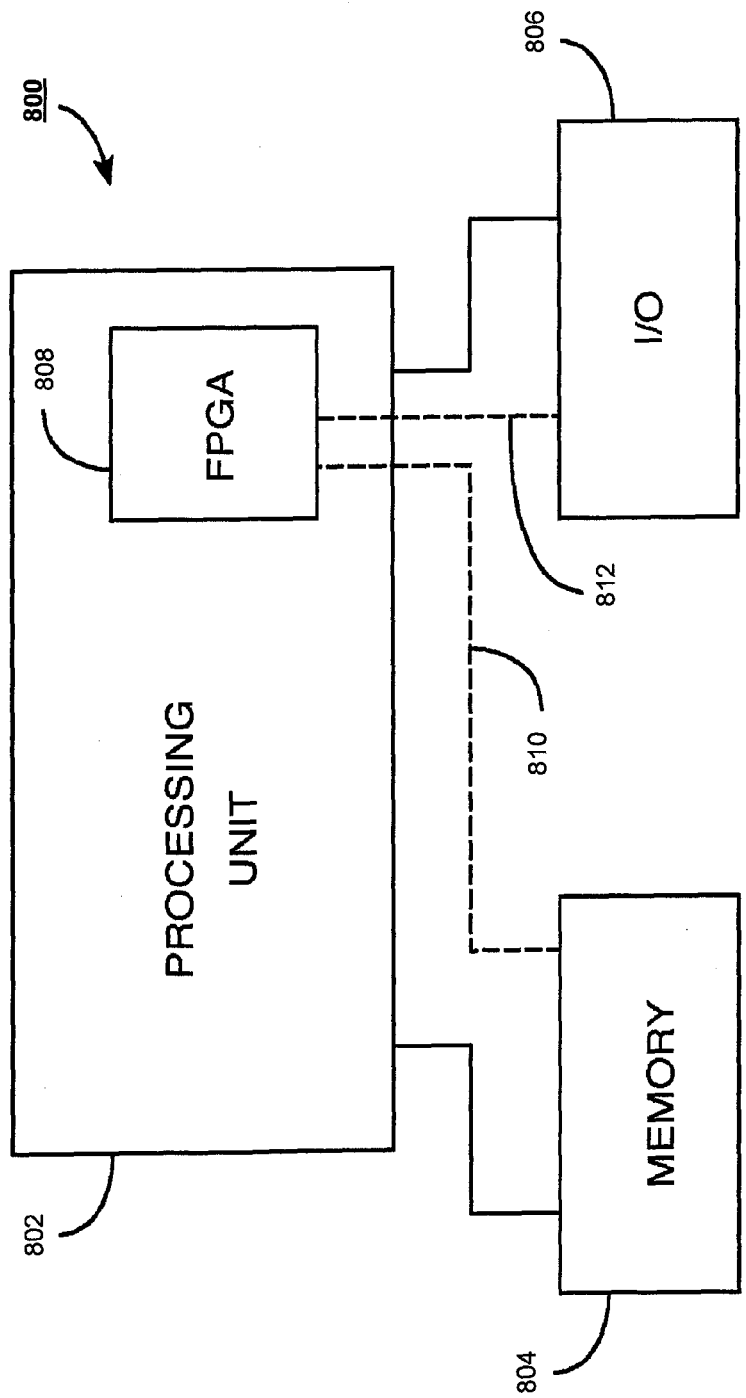
FIG. 8 is a block diagram of an exemplary digital system that may be configured to utilize an embodiment of the present invention.

The present invention can also be implemented in a system that has a FPGA as one of several components. FIG. 8 shows a block diagram of an exemplary digital system 800 that can embody techniques of the present invention. System 800 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 may be provided on a single board, on multiple boards, or within multiple enclosures.

System 800 includes a processing unit 802, a memory unit 804, and an input/output (I/O) unit 806 interconnected together by one or more buses. According to this exemplary embodiment, FPGA 808 is embedded in processing unit 802. FPGA 808 can serve many different purposes within the system 800. FPGA 808 can, for example, be a logical building block of processing unit 802, supporting its internal and external operations. FPGA 808 is programmed to implement the logical functions necessary to carry on its particular role in system operation. FPGA 808 can be specially coupled to memory 804 through connection 810 and to I/O unit 806 through connection 812.

Processing unit 802 may direct data to an appropriate system component for processing or storage, execute a program stored in memory 804, receive and transmit data via I/O unit 806, or other similar function. Processing unit 802 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 808 may control the logical operations of the system. As another example, FPGA 808 acts as a reconfigurable processor that may be reprogrammed as needed to handle a particular computing task. Alternately, FPGA 808 may itself include an embedded microprocessor. Memory unit 804 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. An integrated circuit comprising:
   a data path within a physical coding sublayer circuit module for data communications, the data path being arranged to transfer a data signal through pipelined stages formed by a series of logic blocks;
   an error signal path arranged to transfer a synchronous error signal through the series of logic blocks of the data path; and
   error injection circuitry arranged to controllably inject an error event into the data signal at a specific location as the data signal passes through the series of logic blocks of the data path,
   wherein the injection of the error event at the specific location depends upon a setting of a configuration bit, and
   wherein the synchronous error signal acts as a trigger for the injection of the error event at the specific location indicated by the setting of the configuration bit.

2. The integrated circuit of claim 1, wherein the data path is multiple bits wide, and the synchronous error signal is one bit wide.

3. The integrated circuit of claim 2, wherein the error injection circuitry includes data storage for a plurality of error injection configuration bits, and wherein the plurality of configuration bits is configurable to indicate multiple error injection events.

4. The integrated circuit of claim 3 further comprising:
an input for receiving an external error signal,
wherein the external error signal also acts as a trigger for the injection of the multiple error injection events indicated by the plurality of configuration bits.

5. The integrated circuit of claim 3 further comprising:
a host controller communicatively coupled to control and status registers for controllably setting or resetting the plurality of configuration bits.

6. A transceiver comprising:
a data transmission path arranged to transfer an outgoing data signal through pipelined stages formed by a first series of protocol logic blocks;
a first error signal path arranged to transfer a first error signal through the first series of protocol logic blocks;
a data reception path arranged to transfer an incoming data signal through pipelined stages formed by a second series of protocol logic blocks;
a second error signal path arranged to transfer a second error signal through the second series of protocol logic blocks; and
error injection circuitry arranged to controllably inject a first error event into the outgoing data signal at a first location specified by a first configuration flag of a first plurality of configuration flags when triggered by the first error signal and to controllably inject a second error event into the incoming data signal at a second location specified by a second configuration flag of a second plurality of configuration flags when triggered by the second error signal.

7. The transceiver of claim 6, wherein the outgoing data signal is multiple-bits wide, the incoming data signal is multiple-bits wide, and the data transmission and reception paths are within a physical coding sublayer circuit module for data communications.

8. The transceiver of claim 7, wherein the first plurality of configuration flags is configurable to indicate multiple error injection events for the data transmission path, and wherein the second plurality of configuration flags is configurable to indicate multiple error injection events for the data reception path.

9. The transceiver of claim 8 further comprising:
an input for receiving an external error signal in a protocol logic block in the data transmission path,
wherein the external error signal acts as an additional trigger for the injection of the first error event into the outgoing data signal.

10. The transceiver of claim 9 further comprising:
error detection circuitry within a protocol logic block in the data reception path, the error detection circuitry being arranged to generate said external error signal in response to detection of an error in the incoming data signal.

11. The transceiver of claim 8 further comprising:
a host controller communicatively coupled to control and status registers for controllably setting or resetting the plurality of error injection configuration flags.

12. The transceiver of claim 6 further comprising:
a loopback signal path arranged from a protocol logic block in the data transmission path to a protocol logic block in the data reception path.

13. The transceiver of claim 12 further comprising:
a first bypass path arranged for the outgoing data signal and the first error signal to bypass at least one protocol logic block in the data transmission path; and
a second bypass path arranged for the incoming data signal and the second error signal to bypass at least one protocol logic block in the data reception path.

14. The transceiver of claim 12, wherein the loopback signal path is arranged from a last protocol logic block in the data transmission path to a first protocol logic block in the data reception path.

15. The transceiver of claim 14 further comprising:
a first bypass path arranged for the outgoing data signal and the first error signal to bypass the last protocol logic block in the data transmission path; and
a second bypass path arranged for the incoming data signal and the second error signal to bypass the first protocol logic block in the data reception path.

16. A method for controlled error injection within a physical coding sublayer circuit module in an integrated circuit, the method comprising:
transferring a first data signal through a first series of logic blocks of a first data path within the physical coding sublayer circuit module;
transferring a first error signal through the first series of logic blocks of the first data path, wherein the transferring of the first error signal is synchronized with the transferring of the first data signal; and
injecting a first error event into the first data signal at a specific location in the first data path which is specified by setting a configuration flag of a plurality of configuration flags, wherein the first error signal acts as a trigger for the injection of the first error event at the specific location in the first data path.

17. The method of claim 16 further comprising:
transferring a second data signal through a second series of logic blocks of a second data path within the physical coding sublayer circuit module;
transferring a second error signal through the second series of logic blocks of the second data path, wherein the transferring of the second error signal is synchronized with the transferring of the second data signal; and
injection a second error event into the second data signal at a specific location in the second data path which is specified by setting a configuration flag of a second plurality of configuration flags, wherein the second error signal acts as a trigger for the injection of the second error event at the specific location in the second data path.

18. The method of claim 17, wherein the first data path comprises a data transmission path, and wherein the second data path comprises a data reception path.

19. The method of claim 18 further comprising:
looping the first data signal from an end of the data transmission path to a start of the data reception path.

20. The method of claim 19, further comprising:
bypassing by the first data signal at least a last logic block in the data transmission path; and
bypassing by the second data signal at least a first logic block in the second data path.

* * * * *